(12) United States Patent
Meier et al.

(10) Patent No.: US 10,271,431 B2
(45) Date of Patent: Apr. 23, 2019

(54) CONTACT ARRANGEMENT, PREFERABLY FOR A POWER ELECTRONICS SYSTEM

(71) Applicant: Robert Bosch GmbH, Stuttgart (DE)

(72) Inventors: Andreas Meier, Pfullingen (DE); David Tastekin, Stuttgart (DE); Sebastian Goepfert, Stuttgart (DE); Thomas Wiesa, Vaihingen (DE); Hao Jin, Jiangsu (CN); Qiang Hou, Suzhou (CN); Zhenzhong Shi, Jiangsu (CN)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 15/570,067

(22) PCT Filed: Mar. 11, 2016

(86) PCT No.: PCT/EP2016/055350
§ 371 (c)(1),
(2) Date: Oct. 27, 2017

(87) PCT Pub. No.: WO2016/173764
PCT Pub. Date: Nov. 3, 2016

(65) Prior Publication Data
US 2018/0124919 A1    May 3, 2018

(30) Foreign Application Priority Data

Apr. 30, 2015  (DE) .......... 10 2015 208 005

(51) Int. Cl.
*H05K 3/30* (2006.01)
*H05K 1/14* (2006.01)
*H05K 7/14* (2006.01)

(52) U.S. Cl.
CPC ............. *H05K 1/145* (2013.01); *H05K 3/301* (2013.01); *H05K 7/142* (2013.01); *H05K 7/1432* (2013.01)

(58) Field of Classification Search
CPC ........ H05K 1/145; H05K 3/301; H05K 3/306; H05K 7/142
See application file for complete search history.

(56) References Cited

U.S. PATENT DOCUMENTS

| 6,493,233 B1 * | 12/2002 | De Lorenzo | ........... | H05K 3/325 174/138 G |
| 6,712,544 B2 * | 3/2004 | Kruger | ................. | F16B 5/0233 403/370 |

(Continued)

OTHER PUBLICATIONS

International Search Report for Application No. PCT/EP2016/055350 dated Jun. 20, 2016 (English Translation, 2 pages).

*Primary Examiner* — Hoa C Nguyen
(74) *Attorney, Agent, or Firm* — Michael Best & Friedrich LLP

(57) ABSTRACT

The present invention relates to a contact arrangement (1), preferably for a power electronics system, comprising a printed circuit board (2) with a fastening hole (5), comprising a metal sleeve (8) which is inserted into the fastening hole (5), wherein the sleeve (8) makes contact with, preferably is soldered to, the printed circuit board (2), comprising a base (15) on which the sleeve (8) lies in order to make electrical contact, and comprising a fastening element (11) which protrudes through the sleeve (8), wherein one end of the fastening element (11) is fixedly connected to the base (15) and a head (12) is formed or arranged at the other end, wherein the head (12) of the fastening element (11) lies only on the sleeve (8) and not on the printed circuit board (2), and wherein the sleeve (8) projects beyond the printed circuit board (2) by way of a first projection (10) on that side which faces the base (15), wherein the first projection spaces apart the printed circuit board (2) and the base (15).

11 Claims, 3 Drawing Sheets

(56) References Cited

U.S. PATENT DOCUMENTS

| | | | | |
|---|---|---|---|---|
| 6,824,399 B2* | 11/2004 | Smith | ................... | H05K 3/301 |
| | | | | 411/85 |
| 9,472,924 B2* | 10/2016 | Majcher | ............. | H05K 7/20927 |
| 2003/0201120 A1 | 10/2003 | Forte et al. | | |
| 2004/0264142 A1* | 12/2004 | Mejia | ....................... | G06F 1/20 |
| | | | | 361/719 |
| 2006/0094296 A1 | 5/2006 | Edwards et al. | | |

* cited by examiner

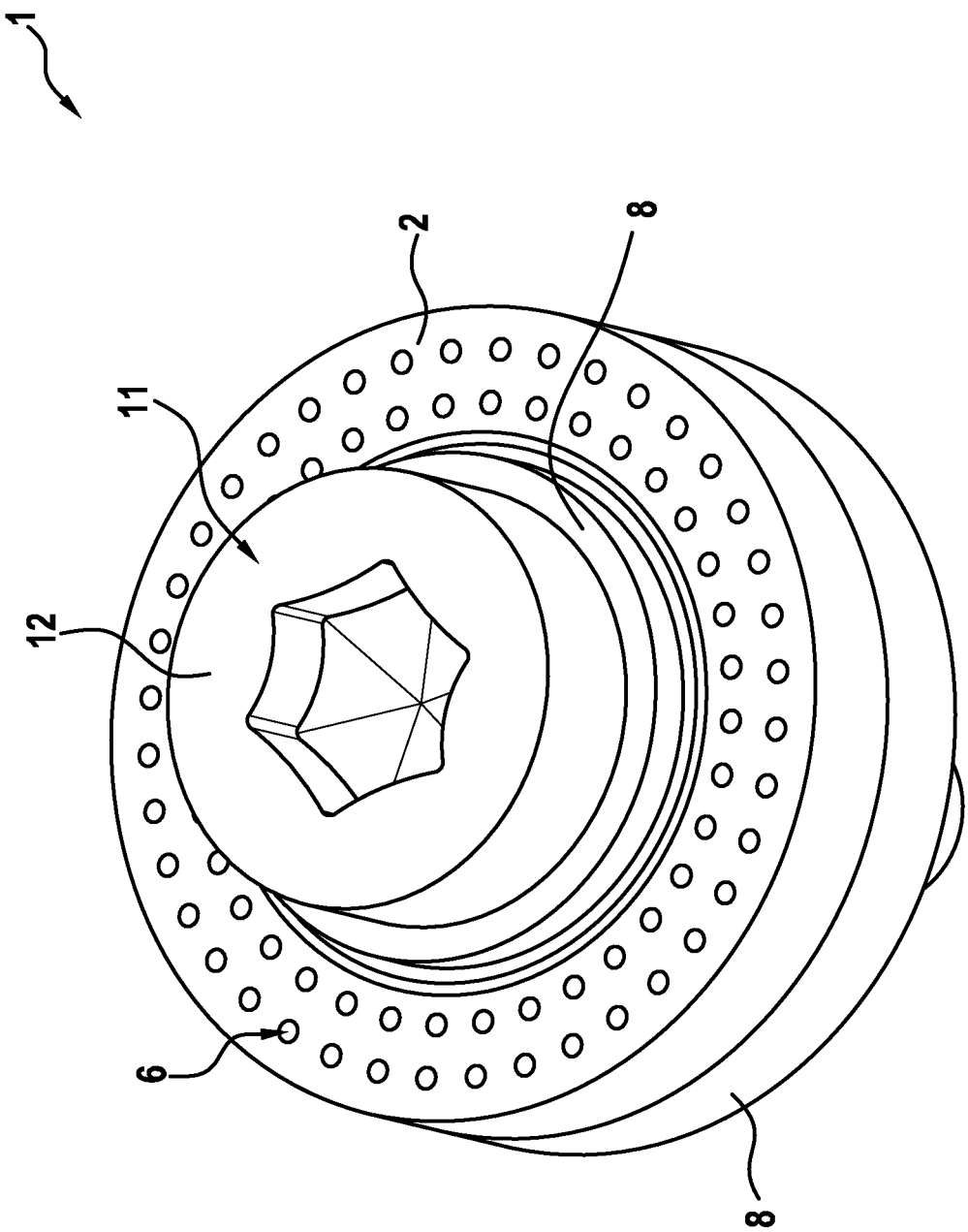

CONTACT ARRANGEMENT, PREFERABLY FOR A POWER ELECTRONICS SYSTEM

BACKGROUND OF THE INVENTION

The present invention relates to as contact arrangement. The contact arrangement is particularly used in a power electronics system and serves to mechanically connect and electrically conductive contact a printed circuit board comprising a base.

Printed circuit boards in power electronics systems are typically screwed directly to the corresponding base (also: contact point or housing). Such screwed connections are only suitable to a limited extent to conduct high currents over the correspondingly high service life. The reason for this is the setting behavior of the screw connection by means of the creeping of the printed circuit board and the ensuing increasing contact resistance. This leads to inadmissible contact resistance and breakdown of the connection in high current applications.

SUMMARY OF THE INVENTION

The contact arrangement according to the invention enables a force-fitted connection of the printed circuit board to the base, which is used over a long service life for conducting current, in particular high currents. In so doing, a simple and reliable contacting of the printed service board for discharging high currents occurs independently of physical properties of the organic material (printed circuit board base material). To this end, provision is made for a contact arrangement according to the invention. Said contact arrangement comprises a printed circuit board with a fastening hole. A sleeve made from metal is inserted into the contact hole. The metal sleeve is contacted to the printed circuit board or respectively to at least one conductive location on the printed circuit board. The sleeve is particularly soldered to the printed circuit board. In addition, the contact arrangement comprises a base, on which the sleeve for electrical contacting lies. A fastening element protrudes through the sleeve. An end of the fastening element is fixedly connected to the base. A head is formed or arranged at the other end of the fastening element. If the fastening element is, for example, a screw, the head is then either the screw head or a nut screwed onto the screw. Any washer or shim is considered to be a head in the sense of the invention. In addition, there is the option of using a bolt arranged fixedly in the base as the fastening element. This bolt can be staked (peened over). The staked region of the bolt then forms the head. In a further alternative, a rivet can be used as the fastening element. In this case, a head is also formed. Provision is made according to the invention for the head of the fastening element to lie only on the sleeve and not, for example, on the printed circuit board. Furthermore, a first projection is formed on the side of the sleeve facing the base. This first projection spaces apart the printed circuit board from the base. Due to the fact that the head only touches the sleeve and the first projection is arranged at the same time, the introduction of force of the fastening element occurs only into the sleeve and not directly into the printed circuit board. The force-fitted connection between sleeve and base is thus completely independent of the physical properties of the printed circuit board, in particular of the setting behavior of the printed circuit board. The current flows from the printed circuit board into the sleeve and from the sleeve into the base and/or from the sleeve via the fastening element into the base. Of course, a plurality of fastening holes comprising correspondingly a plurality of sleeves and a plurality of fastening elements can be arranged on a printed circuit board.

As described above, the force introduction from the head occurs into the sleeve and not into the printed circuit board. To this end, there are two preferred variants, which can also be combined with one another. Provision is made according to the first variant for an outside diameter of the sleeve on the side facing the head to be greater than a head diameter of the head. As previously described, the head can be variously configured. Even a shim or washer has to be considered a head within the scope of the invention, so that the largest diameter of the head resting on the sleeve is defined as the "head diameter". The head rests only on the sleeve and not, for example, on the printed circuit board due to this correspondingly large configuration of the sleeve. Provision is made according to the second variant for the sleeve on the side facing the head to project beyond the printed circuit board by way of a second projection. This second projection ensures that the head only rests on the sleeve and does not touch the printed circuit board. In so doing, provision is advantageously made for the second projection to be at least 150 µm, in particular to be at least 300 µm. The sleeve can be correspondingly deformed when tightening the fastening element by means of this sufficiently large second projection without contact occurring between head and printed circuit board.

An inside diameter of the fastening hole is advantageously larger than an outside diameter of the sleeve. The interstice resulting therefrom is preferably at least in part filled with solder. As a result, a relatively massive solder connection occurs between sleeve and printed circuit board.

In addition, provision is preferably made for the printed circuit board to be plated-through. The term "plated-through" is to be understood by the fact that at least two layers of the printed circuit board are connected in an electrically conductive manner.

Provision is furthermore made for the first projection to be designed as a collar of the sleeve. A collar thus is located between the printed circuit board and the base, said collar being particularly a one-piece component of the entire sleeve. The printed circuit board rests on one side of the collar. The opposite side of the collar rests on the base. The collar provides sufficient surface for the electrically conductive connection between sleeve and base.

Provision is made in a particularly preferred manner for the collar to be soldered to the printed circuit board.

In addition, at least one additional hole is preferably provided in the printed circuit board. The at least one additional hole advantageously extends parallel to the fastening hole. The at least one additional hole extends up to the collar and is at least partially filled with solder. Hence, the solder extends not only into a gap between printed circuit board and collar but also into the at least one additional hole. A plurality of additional holes is advantageously arranged around the fastening hole. In a particularly preferred manner, at least five additional holes are used in this case. A diameter of the individual additional hole is advantageously substantially smaller than a diameter of the fastening hole. A diameter of the additional hole is particularly at most 25% of the diameter of the fastening hole. As a result, the printed circuit board remains sufficiently stable.

The invention furthermore comprises a power electronics system. The power electronics system is particularly used in a vehicle. Said power electronics system comprises at least one contact arrangement as said arrangement was previously described. The advantageous configurations and dependent claims described within the scope of the contact arrangement according to the invention are correspondingly advantageously used for the power electronics system. In a particularly preferred manner, this relates to a power electronics system for an electric or hybrid vehicle. The contact arrangement is advantageously used for contacting a DC/DC converter of a battery management system or a steering system. Furthermore, the contact arrangement can, e.g., also be used in industrial electronics systems.

BRIEF DESCRIPTION OF THE DRAWINGS

Exemplary embodiments of the invention are described below in detail with reference to the accompanying drawings. In the drawings:

FIG. 3 shows an isometric view of an inventive contact arrangement according to a third exemplary embodiment.

DETAILED DESCRIPTION

Three exemplary embodiments of a contact arrangement 1 are described below using FIGS. 1 to 3. Identical or functionally identical components are provided with the same reference signs in all of the exemplary embodiments.

Figure 1:
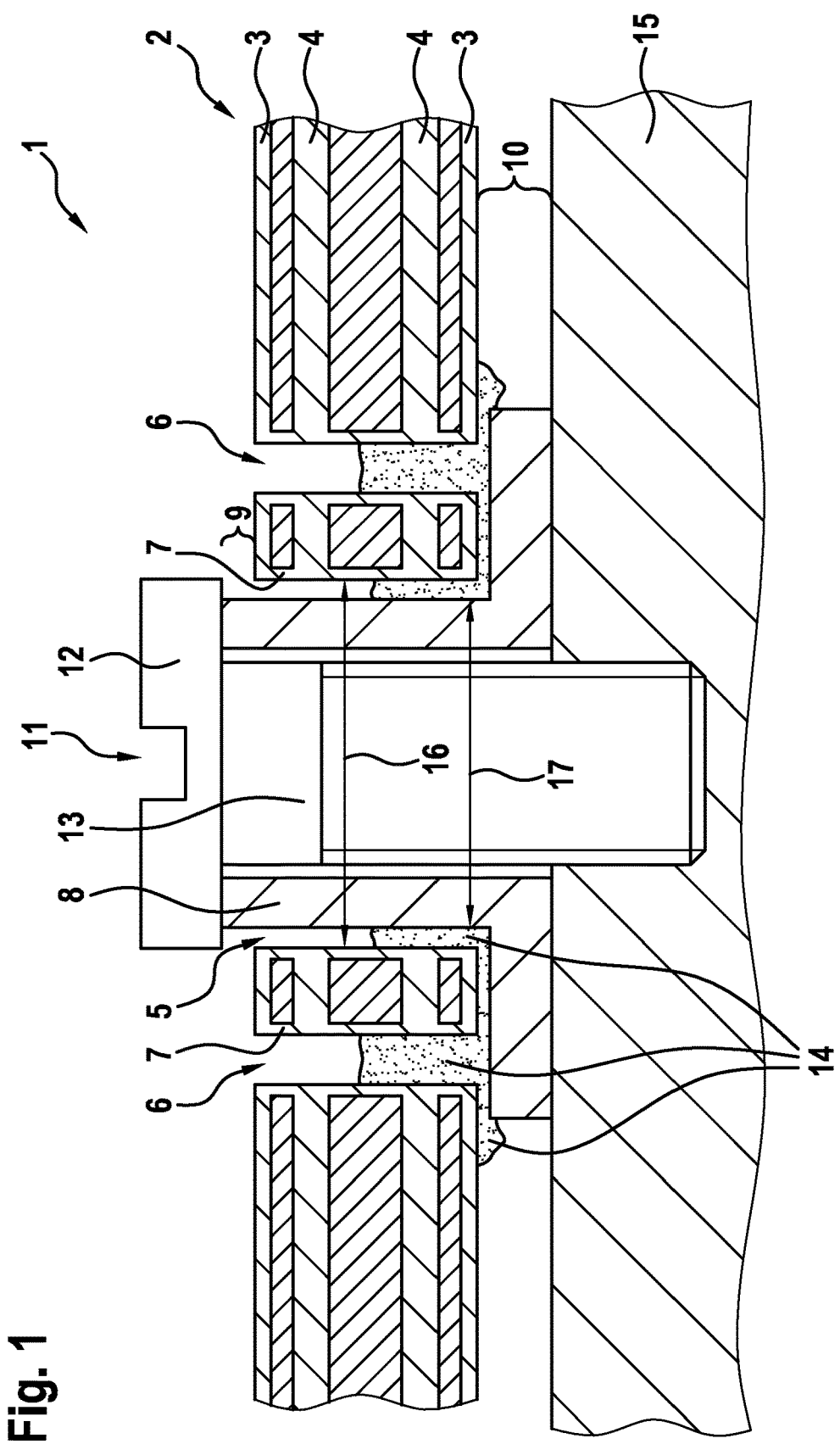
FIG. 1 shows a sectional view of an inventive contact arrangement according to a first exemplary embodiment.

According to FIG. 1, the contact arrangement 1 comprises a printed circuit board 2. This printed circuit board 2 is contacted to a base 15 in an electrically conductive manner and at the same time is connected to the base 15 in a force-fitted manner. Only one connection point is depicted. A plurality of similarly built contact arrangements 1 can, however, be used between printed circuit board 2 and base 15.

The printed circuit board 2 comprises two outer layers 3 and a plurality of inner layers 4. The different layers 3, 4 are insulated from one another by a corresponding substrate. A fastening hole 5 in the form of a through hole is configured in the circuit board 2. A plurality of small additional holes 6 is configured around the fastening hole 5. The additional holes 6 are also designed as through holes. In the first exemplary embodiment, the fastening hole 5 and the additional holes 6 are through-plated. To this end, a through-plating 7 is provided which connects the individual layers 3, 4 to one another in an electrically conductive manner.

A sleeve 8 made from metal is inserted into the fastening hole 5. The sleeve 8 has a first projection 10 on the side thereof facing the base 15. This first projection 10 is designed as a collar. This collar has a correspondingly large diameter so that said collar extends over the additional holes 6.

A fastening element 11 is inserted in the sleeve 8. The fastening element 11 comprises a shaft 13. The shaft 13 is connected fixedly to the base. In the exemplary embodiment shown, the shaft 13 is screwed to the base 15. A head 12 is formed at the other end of the shaft 13. The sleeve 8 has a second projection 9 on the side facing the head 12. The sleeve 8 thus projects beyond the printed circuit board 2 on both sides. Due to the second projection 9, the head 12 touches only the sleeve 8 and not the printed circuit board 2. Hence, a force application occurs directly and exclusively over the fastening element 11 into the sleeve 8 and not, for example, into the printed circuit board 2.

Solder 14 is provided for the mechanical and electrically conductive connection between the printed circuit board 2 and the sleeve 8. The fastening hole 5 has an inside diameter 16. An outside diameter 17 of the sleeve is smaller than the inside diameter 16 so that a free space remains. This free space is filled with solder 14. In addition, the solder 14 is situated between the collar of the sleeve 8 and the bottom side of the printed circuit board 2. Moreover, the additional holes 6 are at least in part filled with solder 14.

Figure 2:
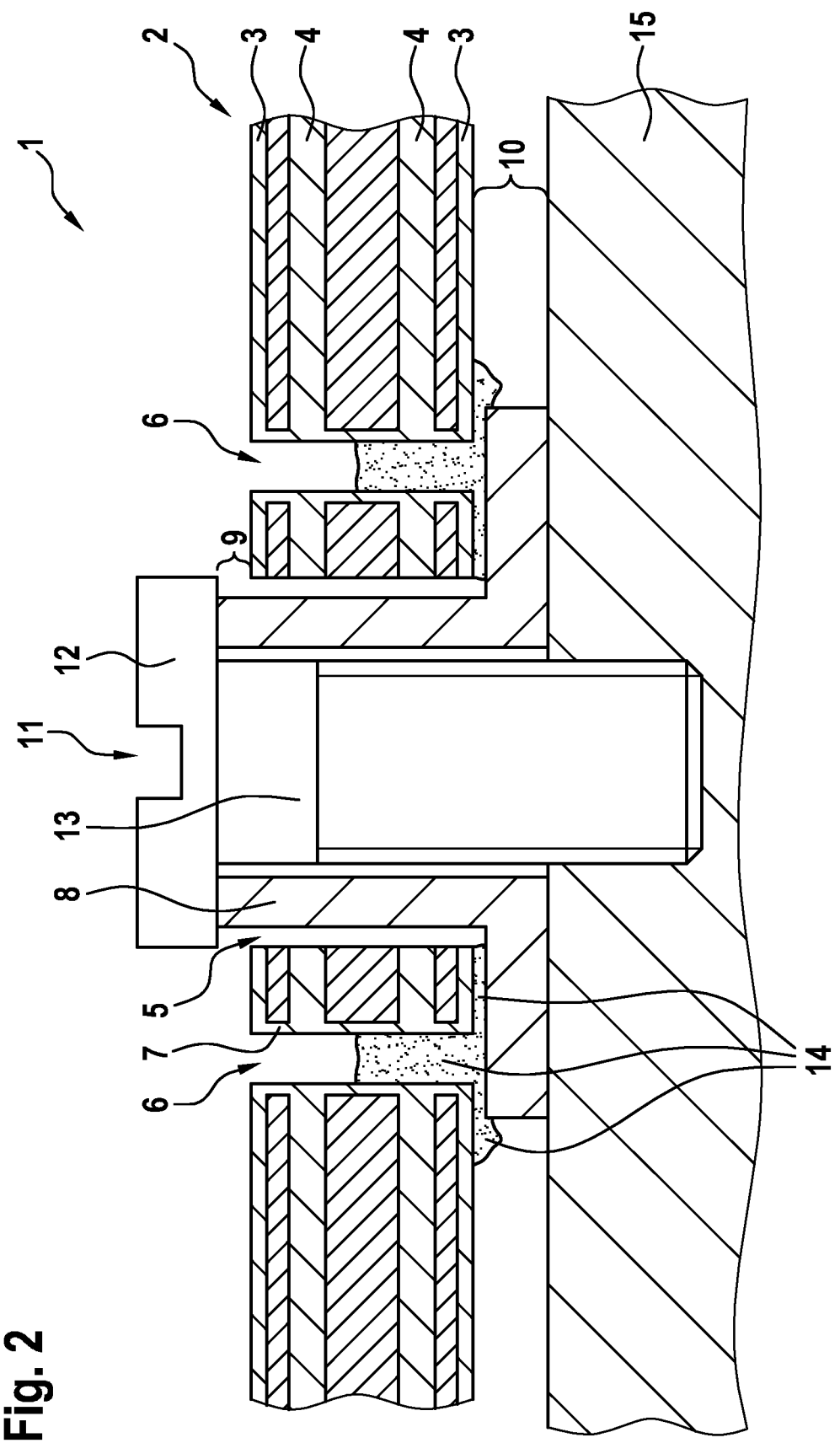
FIG. 2 shows a sectional view of an inventive contact arrangement according to a second exemplary embodiment.

FIG. 2 shows the contact arrangement 1 according to the second exemplary embodiment. The second exemplary embodiment corresponds as much as possible with the first exemplary embodiment. The printed circuit board 2 is, however, not through-plated within the fastening hole 5 in the second exemplary embodiment. Accordingly the solder 14 can possibly be eliminated in the fastening hole 5. Nevertheless, a sufficiently mechanical and electrical connection occurs via the solder 14 in the additional holes 6 and/or in the gap between the bottom of the printed circuit board 2 and the collar of the sleeve 8.

FIG. 3 shows the contact arrangement 1 according to the third exemplary embodiment in an isometric view. In the third exemplary embodiment, the sleeve 8 does not absolutely have a second projection 9. This results from the fact that in this case the head diameter of the head 12 is smaller than the outside diameter of the sleeve on the side facing the head. As a result, the head is also only in contact with the sleeve 8 and not with the printed circuit board 2 independently of the second projection 9.

The three exemplary embodiments show a screw as the fastening element. The head is thereby formed by the head of the screw. Alternatively, the head 12 could also be formed by means of a nut, which is screwed onto the threads of the shaft 13. Instead of a screw, the fastening element 11 can be a bolt that is fixedly connected to the base 15. This bolt can be staked in order to configure the head. In addition, the fastening element 11 can be designed as a rivet. In all of these variants, there is a kind of head 12 which, by means of a corresponding design of the sleeve 8, only acts on the sleeve 8 and does not touch the printed circuit board 2.

The invention claimed is:

1. A contact arrangement (1), comprising:
    a printed circuit board (2) with a fastening hole (5),
    a metal sleeve (8) which is inserted into the fastening hole (5), wherein the sleeve (8) makes contact with the printed circuit board (2), and wherein the metal sleeve (8) makes contact with at least one conductive layer of the printed circuit board (2),
    a base (15) on which the sleeve (8) lies in order to make electrical contact, and a fastening element (11) which protrudes through the sleeve (8), wherein one end of the fastening element (11) is fixedly connected to the base (15) and an other end of the fastening element has a head (12),
    wherein the head (12) of the fastening element (11) lies only on the sleeve (8) and not on the printed circuit board (2), and
    wherein the sleeve (8) projects beyond the printed circuit board (2) by way of a first projection (10) on a side which faces the base (15), wherein the first projection spaces apart the printed circuit board (2) from the base (15);
    characterized in that the first projection (10) is a collar of the sleeve (8), wherein the printed circuit board (2) lies on one side of the collar and an opposite side of the collar lies on the base (15) and comprising at least one additional hole (6) in the printed circuit board (2), wherein the at least one additional hole (6) extends up to the collar and is at least in part filled with solder.

2. The contact arrangement (1) according to claim 1, characterized in that an outside diameter (17) of the sleeve (8) on a side which faces the head (12) is greater than a head diameter of the head (12).

3. The contact arrangement (1) according to claim 1, characterized in that an inside diameter (16) of the fastening hole (5) is greater than an outside diameter (17) of the sleeve (8), wherein the space between the sleeve (8) and the fastening hole (5) is at least in part filled with solder (14).

4. The contact arrangement (1) according to claim 1, characterized in that the printed circuit board (2) is plated-through in the fastening hole (5).

5. The contact arrangement (1) according to claim 1, characterized in that the collar is soldered to the printed circuit board (2).

6. The contact arrangement (1) according to claim 1, characterized in that the printed circuit board (2) is plated-through in the at least one additional hole (6).

7. The contact arrangement (1) according to claim 1, characterized in that the fastening element (11) is a screw, a rivet or a staked bolt.

8. A power electronics system comprising at least one contact arrangement (1) according to claim 1.

9. The contact arrangement (1) according to claim 1, characterized in that the sleeve (8) is soldered to the printed circuit board (2).

10. The contact arrangement (1) according to claim 1, characterized in that the sleeve (8) on a side which faces the head (12) projects beyond the printed circuit board (2) by way of a second projection.

11. The contact arrangement (1) according to claim 10, characterized in that an outside diameter (17) of the sleeve (8) on a side which faces the head (12) is greater than a head diameter of the head (12).

* * * * *